United States Patent
Roberts et al.

(10) Patent No.: US 12,132,453 B2
(45) Date of Patent: Oct. 29, 2024

(54) T-MATCH TOPOLOGY WITH BASEBAND TERMINATION

(71) Applicant: NXP USA, Inc., Austin, TX (US)

(72) Inventors: Jeffrey Spencer Roberts, Tempe, AZ (US); Ning Zhu, Chandler, AZ (US); Damon G. Holmes, Scottsdale, AZ (US)

(73) Assignee: NXP USA, Inc., Austin, TX (US)

( * ) Notice: Subject to any disclaimer, the term of this patent is extended or adjusted under 35 U.S.C. 154(b) by 553 days.

(21) Appl. No.: 17/471,228

(22) Filed: Sep. 10, 2021

(65) Prior Publication Data

US 2023/0079916 A1    Mar. 16, 2023

(51) Int. Cl.
  *H03F 3/195*    (2006.01)
  *H03F 1/02*    (2006.01)
  *H03F 1/56*    (2006.01)

(52) U.S. Cl.
  CPC ............ *H03F 1/565* (2013.01); *H03F 1/0288* (2013.01); *H03F 3/195* (2013.01); *H03F 2200/222* (2013.01); *H03F 2200/387* (2013.01); *H03F 2200/451* (2013.01)

(58) Field of Classification Search
  CPC ........ H03F 1/565; H03F 1/0288; H03F 3/195; H03F 2200/222; H03F 2200/387; H03F 2200/451
  USPC ........................................................ 330/307
  See application file for complete search history.

(56) References Cited

U.S. PATENT DOCUMENTS

| 9,692,363 | B2 | 6/2017 | Zhu et al. |
| 9,979,360 | B1* | 5/2018 | McLaren ............... H01L 23/66 |
| 10,541,653 | B2 | 1/2020 | Zhu et al. |
| 10,742,178 | B2 | 8/2020 | Zhu et al. |

OTHER PUBLICATIONS

Specification for U.S. Appl. No. 17/111,913, filed Dec. 4, 2019; 50 pgs.

* cited by examiner

*Primary Examiner* — Andrea Lindgren Baltzell
*Assistant Examiner* — Khiem D Nguyen

(57) ABSTRACT

Embodiments of RF amplifiers and packaged RF amplifier devices each include an amplification path with a transistor die, and an output-side impedance matching circuit having a T-match circuit topology. The output-side impedance matching circuit includes a first inductive element connected between the transistor output terminal and a quasi RF cold point node, a second inductive element connected between the quasi RF cold point node and an output of the amplification path, and a first capacitance connected between the quasi RF cold point node and a ground reference node. The RF amplifiers and devices also include a baseband termination circuit connected to the quasi RF cold point node, which includes a third inductive element, a resistor, and a second capacitance in series between the quasi RF cold point node and the ground reference node and a third capacitance between a baseband termination circuit node and the ground reference node.

20 Claims, 12 Drawing Sheets

T-MATCH TOPOLOGY WITH BASEBAND TERMINATION

Various embodiments disclosed herein relate to T-match topology with baseband termination.

BACKGROUND

Wireless communication systems employ power amplifiers for increasing the power of radio frequency (RF) signals. In a cellular base station, for example, a Doherty power amplifier may form a portion of the last amplification stage in a transmission chain before provision of the amplified signal to an antenna for radiation over the air interface. High gain, high linearity, stability, and a high level of power-added efficiency are characteristics of a desirable power amplifier in such a wireless communication system.

In the field of power amplifier device design, it is becoming increasingly desirable to achieve concurrent multi-band, broadband amplification. To successfully design a wideband power amplifier device for concurrent multi-band, broadband operation in a Doherty power amplifier circuit, for example, it is desirable to enable a good broadband fundamental match (e.g., over 20 percent fractional bandwidth) to appropriately handle harmonic frequency interactions, and to enable a wide baseband termination. However, achieving these goals continues to provide challenges to power amplifier device designers.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The description and drawings illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments.

The current high power, broadband gallium nitride (GaN) amplifier designs at 3.5 gigahertz (GHz) face two main issues: low efficiency and gain. To improve the gain, designs using output T-match topology have been considered. Attempts have been made using output T-match topologies to boost RF performance (particularly gain), but these attempts have not been entirely successful. Embodiments of the present invention include output matching topologies that overcome the performance challenges of prior configurations.

Figure 1:
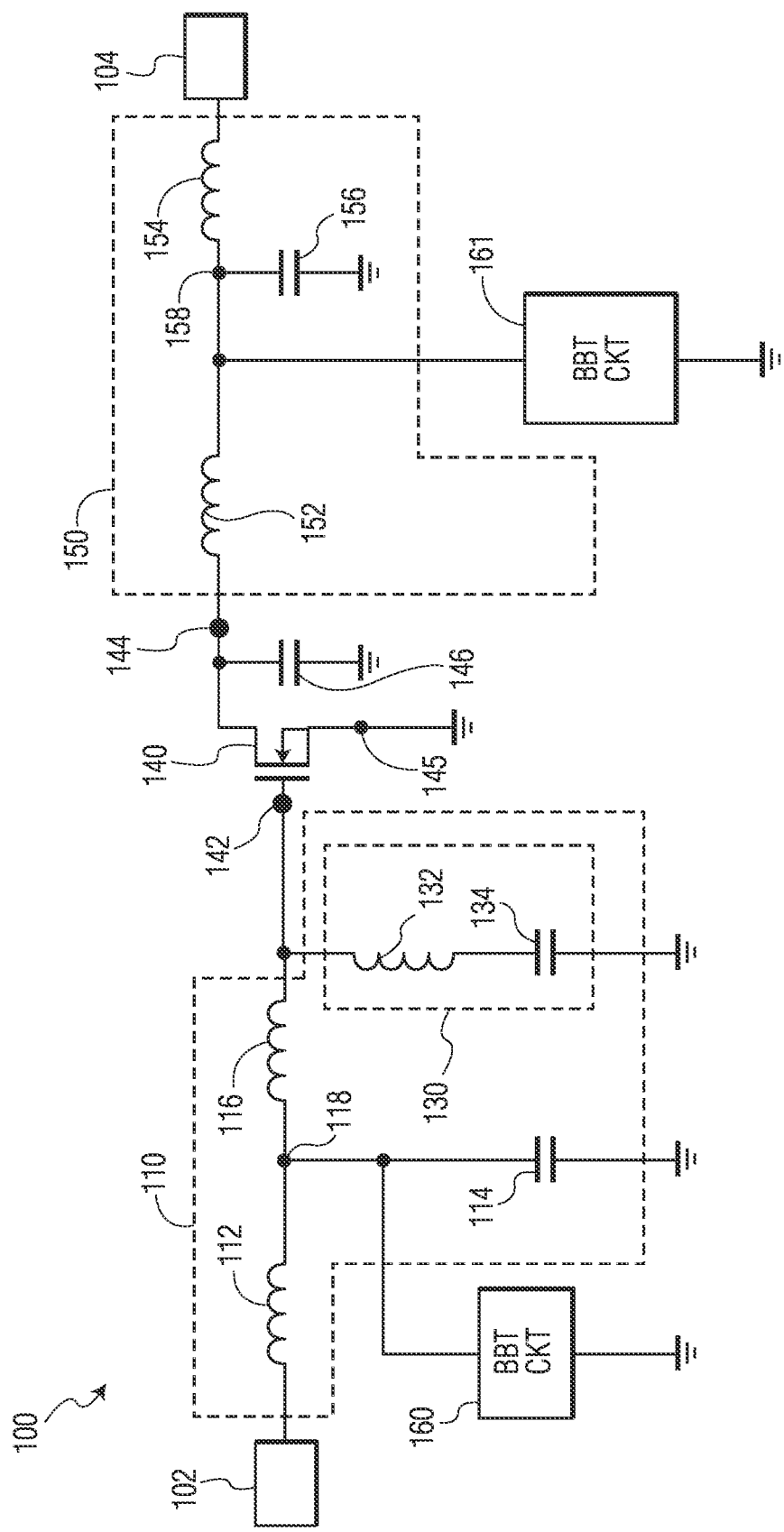
FIG. 1 is a schematic circuit diagram of a power amplifier circuit, in accordance with an example embodiment.

FIG. 1 is a schematic diagram of an RF power amplifier circuit 100. Circuit 100 includes an input 102 (e.g., a first conductive package lead), an input impedance matching circuit 110 (which includes a harmonic termination circuit 130), a transistor 140, an output impedance matching circuit 150, baseband termination (BBT) circuits 160 and 161, and an output lead 104 (e.g., a second conductive package lead), in an embodiment. Each of the input and output 102, 104 may be more generally referred to as an "RF input/output (I/O)."

The input impedance matching circuit 110 (including harmonic termination circuit 130) and baseband termination circuit 160 may be referred to collectively as an "input circuit." Similarly, the output impedance matching circuit 150 and baseband termination circuit 161 may be referred to collectively as an "output circuit."

Although transistor 140 and various elements of the input and output impedance matching circuits 110, 150, the baseband termination circuits 160 and 161, and the harmonic termination circuit 130 are shown as singular components, the depiction is for the purpose of ease of explanation only. Those of skill in the art would understand, based on the description herein, that transistor 140 and/or certain elements of the input impedance matching circuit 110 (including the harmonic termination circuit 130), the output impedance matching circuit 150, and the baseband termination circuits 160 and 161 each may be implemented as multiple components (e.g., connected in parallel or in series with each other). Further, embodiments may include single-path devices (e.g., including a single input lead, output lead, transistor, etc.), dual-path devices (e.g., including two input leads, output leads, transistors, etc.), and/or multi-path devices (e.g., including two or more input leads, output leads, transistors, etc.). Further, the number of input/output leads may not be the same as the number of transistors (e.g., there may be multiple transistors operating in parallel for a given set of input/output leads). The description of transistor 140 and various elements of the input impedance matching circuit 110 (including the harmonic termination circuit 130), the output impedance matching circuit 150, and the baseband termination circuits 160 and 161, below, thus are not intended to limit the scope of the inventive subject matter only to the illustrated embodiments.

Input 102 and output 104 each may include a conductor, which is configured to enable the circuit 100 to be electrically coupled with external circuitry (not shown). More specifically, input 102 and output 104 are physically positioned to span between the exterior and the interior of the device's package, in some embodiments. Input impedance matching circuit 110 (including harmonic termination circuit 130) and baseband termination circuit 160 are electrically coupled between the input 102 and a first terminal 142 of transistor 140 (e.g., the gate terminal of transistor 140), which is also located within the device's interior. Similarly, output impedance matching circuit 150 and baseband termination circuit 161 are electrically coupled between a second terminal 144 of transistor 140 (e.g., the drain terminal of transistor 140) and the output 104.

According to an embodiment, transistor 140 is the primary active component of circuit 100. Transistor 140 includes a control terminal 142 and two current conducting terminals 144, 145, where the current conducting terminals 144, 145 are spatially and electrically separated by a variable-conductivity channel. For example, transistor 140 may be a field effect transistor (FET), which includes a gate (control terminal 142), a drain (a first current conducting terminal 144), and a source (a second current conducting terminal 145). According to an embodiment, and using nomenclature typically applied to FETs in a non-limiting manner, the gate 142 of transistor 140 is coupled to the input impedance matching circuit 110 (including the harmonic termination circuit 130) and the baseband termination circuit 160, the drain 144 of transistor 140 is coupled to the output impedance matching circuit 150 and the baseband termination circuit 161, and the source 145 of transistor 140 is coupled to ground (or another voltage reference). Through the variation of control signals provided to the gate of transistor 140, the current between the current conducting terminals of transistor 140 may be modulated.

According to various embodiments, transistor 140 is a III-V field effect transistor (e.g., a high electron mobility transistor (HEMT)), which has a relatively low drain-source capacitance, Cds, when compared with a silicon-based FET (e.g., an LDMOS FET). In FIG. 1, the drain-source capacitance of transistor 140 is represented with capacitor 146 between the drain of transistor 140 and a transistor output terminal 144. More specifically, capacitor 146 is not a physical component, but instead models the drain-source capacitance of transistor 140. According to an embodiment, transistor 140 may have a drain-source capacitance that is less than about 0.2 picofarads per Watt (pF/W). Further, in some embodiments, transistor 140 may be a gallium nitride (GaN) FET, although in other embodiments, transistor 140 may be another type of III-V transistor (e.g., gallium arsenide (GaAs), gallium phosphide (GaP), indium phosphide (InP), or indium antimonide (InSb)), or another type of transistor that has a relatively low drain-source capacitance. In other embodiments, the transistor 140 may be implemented as a silicon-based FET (e.g., an LDMOS FET or a silicon germanium FET).

Input impedance matching circuit 110 is coupled between the input 102 and the control terminal 142 (e.g., gate) of the transistor 140. Input impedance matching circuit 110 is configured to transform a low input impedance level at the gate terminal 142 to a higher (e.g., intermediate or higher) impedance level (e.g., in a range from about 2 to about 10 Ohms or higher) at input 102. This is advantageous in that it allows the printed circuit board level (PCB-level) matching interface from a driver stage to have an impedance that can be achieved in high-volume manufacturing with minimal loss and variation (e.g., a "user friendly" matching interface).

According to an embodiment, input impedance matching circuit 110 has a T-match configuration, which includes two inductive elements 112, 116 (e.g., two sets of wirebonds) and a shunt capacitance 114. A first inductive element 112 (e.g., a first set of wirebonds) is coupled between input 102 and a node 118, which in turn is coupled to a first terminal of capacitor 114, and a second inductive element 116 (e.g., a second set of wirebonds) is coupled between the node 118 (or the first terminal of capacitor 114) and the control terminal 142 of transistor 140. The second terminal of capacitor 114 is coupled to ground (or another voltage reference). The combination of inductive elements 112, 116 and shunt capacitance 114 functions as a low-pass filter. According to an embodiment, the series combination of inductive elements 112, 116 may have an inductance value in a range between about 20 picohenries (pH) to about 3 nanohenries (nH), and shunt capacitance 114 may have a capacitance value in a range between about 5 picofarads (pF) to about 120 pF. In some embodiments, shunt capacitance 114 may have a relatively-large capacitance (e.g., greater than 10 pF but less than 140 pF) to provide an acceptable RF low-impedance point at node 118.

In addition, harmonic termination circuit 130 is coupled between the control terminal 142 (e.g., gate) of transistor 140 and ground (or another voltage reference). Harmonic termination circuit 130 includes inductive element 132 (e.g., a third set of wirebonds) and capacitance 134 coupled in series between the control terminal 142 of transistor 140 and ground (or another voltage reference), and this series combination of elements functions as a low impedance path to ground for signal energy at a harmonic frequency (e.g., a second harmonic of a fundamental frequency of operation of circuit 100). According to an embodiment, inductive element 132 may have an inductance value in a range between about 20 pH to about 3 nH, and capacitance 134 may have a capacitance value in a range between about 1 pF to about 100 pF, although these components may have values outside of these ranges, as well. For example, at a fundamental frequency of operation of 2.0 GHz, which has a second harmonic at 4.0 GHz, inductive element 132 may have an inductance value of about 120-140 pH, and capacitance 134 may have a capacitance value of about 11-12 pF. The desired inductance and/or capacitance values used to achieve a low impedance path to ground for signal energy at the second harmonic frequency may be affected by mutual coupling between wirebonds used to implement inductors 116 and 132.

According to an embodiment, an RF low-impedance point may present at or coupled to the node 118 between inductive elements 112 and 116, where the RF low-impedance point represents a low impedance point in the circuit for RF signals. According to an embodiment, a baseband termination (BBT) circuit 160 is coupled between node 118 (e.g., or an RF low-impedance point at or coupled to node 118) and the ground reference node. Baseband termination circuit 160 may function to dampen the low frequency resonance (LFR) of circuit 100 caused by the interaction between the input matching circuit 110 and the bias feeds (not shown) by presenting a low impedance at envelope frequencies and/or a high impedance at RF frequencies. Baseband termination circuit 160 essentially may be considered to be "invisible" from an RF matching standpoint, as it primarily effects the impedance at envelope frequencies (i.e., baseband termination circuit 160 provides terminations for the envelope frequencies of circuit 100). Only one baseband termination circuit 160 is shown to be coupled to node 118, and when a single baseband termination circuit 160 is implemented in the input circuit.

On the output side of the circuit 100, output impedance matching circuit 150 is coupled between the first current conducting terminal 144 (e.g., drain) of transistor 140 and the output 104. Output impedance matching circuit 150 is configured to match the output impedance of circuit 100 with the input impedance of an external circuit or component (not shown) that may be coupled to output 104.

According to an embodiment, output impedance matching circuit 150 has a T-match configuration, which includes two inductive elements 152, 154 (e.g., two sets of wirebonds) and a shunt capacitance 156. A first inductive element 152 (e.g., a fourth set of wirebonds) is coupled between terminal 144 of transistor 140 and a node 158, which in turn is coupled to a first terminal of capacitor 156, and a second inductive element 154 (e.g., a fifth set of wirebonds) is coupled between the node 158 (or the first terminal of capacitor 156) and output 104. The second terminal of capacitor 156 is coupled to ground (or another voltage reference). The combination of inductive elements 152, 154 and shunt capacitance 156 functions as a low-pass filter. According to an embodiment, the series combination of inductive elements 152, 154 may have an inductance value in a range between about 20 pH to about 3 nH, and shunt capacitance 156 may have a capacitance value in a range between about 10 pF to about 140 pF. In any event, the value of shunt capacitance 156 is selected to provide an acceptable RF low-impedance point at node 158.

An RF low-impedance point (also referred to as a "quasi RF cold point node") is present at node 158 between inductive elements 152, 154. Again, the RF low-impedance point 158 represents a low impedance point in the circuit for RF signals. According to various embodiments, an additional baseband termination circuit 161 is coupled between the RF low-impedance point 158 and the ground reference node. Again, baseband termination circuit 161 may function to further dampen the LFR of circuit 100 caused by the interaction between the output impedance matching circuit 150 and the bias feeds (not shown) by presenting a low impedance at envelope frequencies and/or a high impedance at RF frequencies. Baseband termination circuit 161 also may be considered to be "invisible" from an RF matching standpoint.

Figure 2:
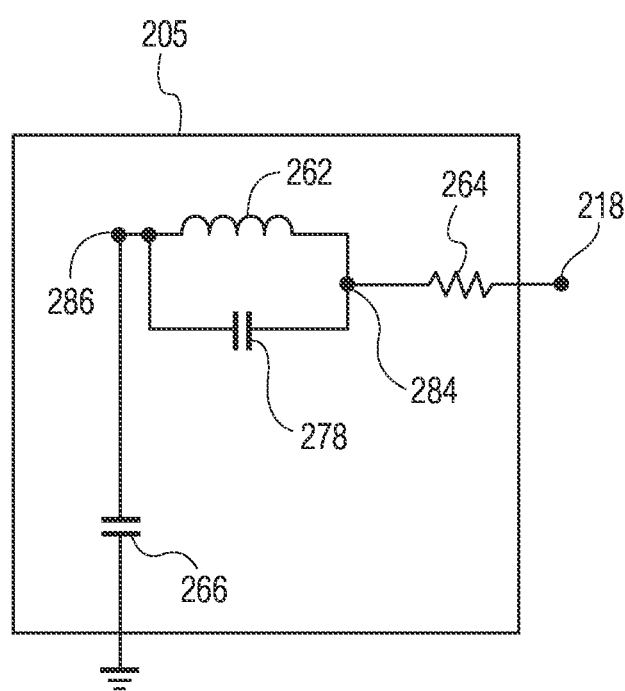
FIG. 2 illustrates an example embodiment of a baseband termination circuit.

Each of the baseband termination circuits 160 and 161 may have circuit configuration as illustrated in FIG. 2. For example, FIG. 2 illustrates the baseband termination circuit 205 is coupled between a connection node 218 (e.g., node 118 and/or node 158, FIG. 1) and ground (or another voltage reference). Further, the baseband termination circuit 205 includes an envelope inductance 262, Lenv, an envelope resistor 264, Renv, and an envelope capacitor 266, Cenv, coupled in series between the connection node 218 and ground. In FIG. 2, the envelope resistor 264 is coupled between node 218 and a node 284, the envelope inductance 262 is coupled between node 284 and a node 286, and the envelope capacitor 266 is coupled between node 286 and ground (or another voltage reference).

Referring to FIG. 2, and according to an embodiment, the envelope inductance 262, may be implemented as an integrated inductance, a wirebond, or wirebond array, as a discrete inductor, and/or as one or more conductors (e.g., one of leads 492-495, FIG. 6 in series with a set of wirebonds) coupling the connection node 218 to the envelope resistor 264 (e.g., via node 280). For example, and as will be described in detail later, when a baseband termination circuit 205 forms a portion of an baseband termination circuit (e.g., BBT circuits 160, 161, FIG. 1), envelope inductance 262 may be integrally formed as a portion of an integrated passive device (IPD), such as IPD 480-483, FIGS. 6-8. For example, envelope inductance 262 may have an inductance value in a range between about 5 pH to about 3000 pH. For a baseband termination circuit (e.g., BBT circuits 160, 161, FIG. 1), envelope inductance 262 desirably has an inductance value less than about 500 pH (e.g., as low as 50-150 pH, in an embodiment, or possibly even lower). In other embodiments, the value of envelope inductance 262 may be lower or higher than the above-given ranges.

Envelope resistor 264 may be implemented as an integrated resistor (e.g., resistor 564, FIG. 5), in an embodiment, or as a discrete resistor, in another embodiment. For example, when the baseband termination circuit 205 forms a portion of a baseband termination circuit (e.g., BBT circuits 160, 161, FIG. 1), envelope resistor 264 may be integrally formed as a portion of an IPD, such as IPD 480-483, FIGS. 6-8. In an embodiment, envelope resistor 264 may have a resistance value in a range between about 0.1 ohm to about 5.0 ohm, although envelope resistor 264 may have a resistance value outside of this range, as well.

Envelope capacitor 266 may be implemented as an integrated capacitor, in an embodiment, or as a discrete capacitor (e.g., as one of discrete capacitors 498, 499, FIG. 6), in another embodiment. When a baseband termination circuit 205 forms a portion of a baseband termination circuit (e.g., BBT circuits 160, 161, FIG. 1), envelope capacitor 266 may be integrally formed as a portion of an IPD, such as IPD 480-483, FIGS. 6-8. In an embodiment, for an baseband termination circuit (e.g., BBT circuits 160, 161, FIG. 1), envelope capacitor 266 may have a capacitance value in a range between about 1 nanofarad (nF) to about 1 microfarad (µF). In other embodiments, envelope capacitor 266 may have a capacitance value outside of these ranges, as well.

In FIG. 2, the baseband termination circuit 205 may include one or more "bypass" or "parallel" capacitors 278, Cpara, which are coupled in parallel with the envelope inductance 262. The bypass capacitor 278 may be implemented as a discrete capacitor, in some embodiments, or as an integrated capacitor, in other embodiments. The bypass capacitor 278 may have a capacitance value in a range between about 3.0 pF to about 1400 pF. In other embodiments, the value of the bypass capacitor 278 may be lower or higher than the above-given range.

In the baseband termination circuits 205 of FIG. 2, parallel-coupled inductance 262 and capacitor 278 form a parallel resonant circuit at frequencies in proximity to the center operational frequency of the device or circuit (e.g., circuit 100) within which circuit 205 is incorporated. As used herein, and according to an embodiment, the term "in proximity to the center operating frequency" means "within 20 percent of the center operating frequency." Accordingly, for example, when a device has a center operating frequency of 2.0 gigahertz (GHz), a frequency that is "in proximity to the center operating frequency" corresponds to a frequency that falls in a range from 1.8 GHz to 2.2 GHz. Although 2.0 GHz is given as an example center operating frequency, a device may have a center operating frequency that is different from 2.0 GHz, as well. In alternate embodiments, the term "in proximity to the center operating frequency" may mean "within 10 percent of the center operating frequency" or "within 5 percent of the center operating frequency."

Because Lenv//Cpara form a parallel resonant circuit at frequencies in proximity to the center operational frequency of the device, the parallel resonant circuit Lenv//Cpara essentially appears as an open circuit to such frequencies. Accordingly, RF energy near the center operational frequency that may be present at the node 218 to which circuit 205 is coupled will be deflected by the parallel resonant circuit Lenv//Cpara. This deflection may be provided even using a relatively low inductance value for inductance 262. For these reasons, circuit 205 may significantly improve the LFR of a device or circuit (e.g., circuit 100) in which it is incorporated by presenting a low impedance at envelope frequencies and a high impedance at RF frequencies.

Referring again to FIG. 1, and as will be described in more detail later in conjunction with FIGS. 6-8, various embodiments of RF amplifier devices may include at least one input-side integrated passive device (IPD) assembly (e.g., IPD assemblies 480, 481, FIG. 6), and at least one output-side IPD assembly (e.g., IPD assemblies 482, 483, FIGS. 6-8). The input-side IPD assembly(ies) (e.g., IPD assemblies 480, 481) include portions of the input circuit 110 (including the harmonic termination circuit 130) and the baseband termination circuit 160. Similarly, the output-side IPD assemblies (e.g., IPD assemblies 482, 483) include portions of the output circuit 150 and the baseband termination circuit 161. More specifically, each IPD assembly may include a semiconductor substrate with one or more integrated passive components. In a particular embodiment, each input-side IPD assembly may include shunt capacitances 114 and 134, and components of baseband termination circuit 160. In other particular embodiments, each output-side IPD assembly may include shunt capacitance 156, and components of baseband termination circuit 161 (e.g., components 262, 264, 266, 278, FIG. 2).

In other embodiments, some portions of the input and output impedance matching circuits 110, 150 and baseband termination circuits 160 and 161 may be implemented as distinct/discrete components or as portions of other types of assemblies (e.g., a low-temperature co-fired ceramic (LTCC) device, a small PCB assembly, and so on). In still other embodiments, some portions of the input and/or output impedance matching circuits 110, 150 may be coupled to and/or integrated within the semiconductor die that includes transistor 140. The below, detailed description of embodiments that include IPD assemblies should not be taken to limit the inventive subject matter, and the term "passive device substrate" or "IPD substrate" means any type of structure that includes a passive device, including an IPD, a LTCC device, a transistor die, a PCB assembly, and so on.

In various embodiments, amplifier circuit 100 also may include bias circuitry (not shown in FIG. 1). To provide a bias voltage to the gate terminal 142 and/or to the drain terminal 144 of the transistor 140, an external bias circuit (not shown) may be connected through the input 102, the output 104, and/or through additional package leads to the gate terminal 142 and/or to the drain terminal 144 of the transistor 140, and the bias voltage(s) may be provided through the input 102, output 104, and/or additional leads.

The RF amplifier circuit 100 of FIG. 1 may be utilized as a single-path amplifier, which receives an RF signal at input 102, amplifies the signal through transistor 140, and produces an amplified RF signal at output 104. Alternatively, multiple instances of the RF amplifier circuit 100 may be utilized to provide a multiple-path amplifier, such as a Doherty power amplifier or another type of multi-path amplifier circuit.

Figure 3:
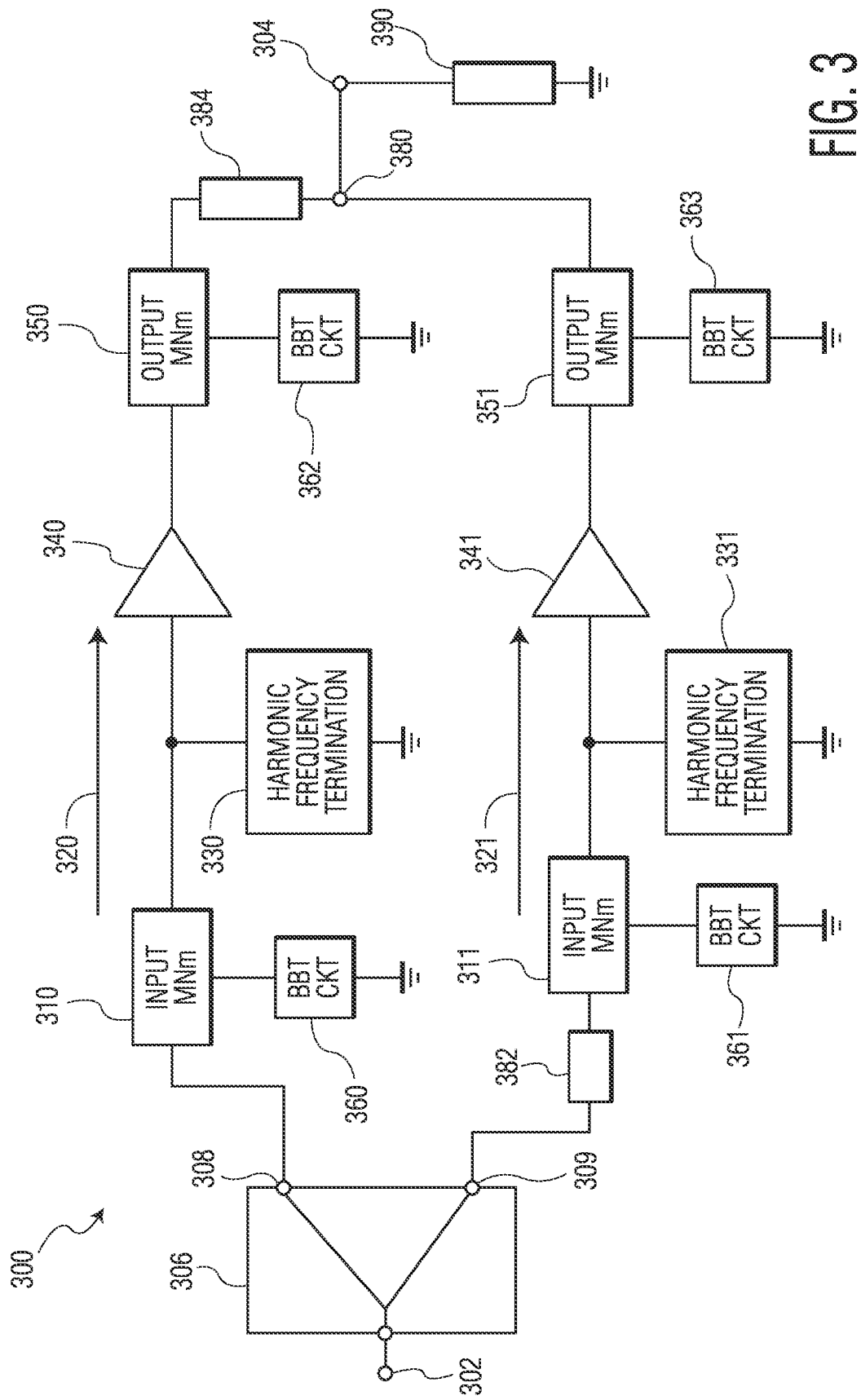
FIG. 3 is a simplified schematic diagram of a Doherty power amplifier, in accordance with an example embodiment.

For example, FIG. 3 is a simplified schematic diagram of a Doherty power amplifier 300 in which embodiments of RF power amplifier circuit 100 may be implemented. Amplifier 300 includes an input node 302, an output node 304, a power divider 306 (or splitter), a main amplifier path 320, a peaking amplifier path 321, and a combining node 380. A load 390 may be coupled to the combining node 380 (e.g., through an impedance transformer, not shown) to receive an amplified RF signal from amplifier 300.

Power divider 306 is configured to divide the power of an input RF signal received at input node 302 into main and peaking portions of the input signal. The main input signal is provided to the main amplifier path 320 at power divider output 308, and the peaking input signal is provided to the peaking amplifier path 321 at power divider output 309. During operation in a full-power mode when both the main and peaking amplifiers 340, 341 are supplying current to the load 390, the power divider 306 divides the input signal power between the amplifier paths 320, 321. For example, the power divider 306 may divide the power equally, such that roughly one half of the input signal power is provided to each path 320, 321 (e.g., for a symmetric Doherty amplifier configuration). Alternatively, the power divider 306 may divide the power unequally (e.g., for an asymmetric Doherty amplifier configuration).

Essentially, the power divider 306 divides an input RF signal supplied at the input node 302, and the divided signals are separately amplified along the main and peaking amplifier paths 320, 321. The amplified signals are then combined in phase at the combining node 380. It is important that phase coherency between the main and peaking amplifier paths 320, 321 is maintained across a frequency band of interest to ensure that the amplified main and peaking signals arrive in phase at the combining node 380, and thus to ensure proper Doherty amplifier operation.

Each of the main amplifier 340 and the peaking amplifier 341 includes one or more single-stage or multiple-stage power transistor integrated circuits (ICs) (or power transistor die) for amplifying an RF signal conducted through the amplifier 340, 341. According to various embodiments, all amplifier stages or a final amplifier stage of either or both the main amplifier 340 and/or the peaking amplifier 341 may be implemented, for example, using a III-V field effect transistor (e.g., a HEMT), such as a GaN FET (or another type of III-V transistor, including a GaAs FET, a GaP FET, an InP FET, or an InSb FET). Where only one of the main amplifier 340 or the peaking amplifier 341 is implemented as a III-V FET, the other amplifier may be implemented as a silicon-based FET (e.g., an LDMOS FET or silicon germanium FET), in some embodiments. In still other embodiments, both the main amplifier 340, and/or the peaking amplifier 341 may be implemented as a silicon-based FET.

Although the main and peaking power transistor ICs may be of equal size (e.g., in a symmetric Doherty configuration), the main and peaking power transistor ICs may have unequal sizes, as well (e.g., in various asymmetric Doherty configurations). In an asymmetric Doherty configuration, the peaking power transistor IC(s) typically are larger than the main power transistor IC(s) by some multiplier. For example, the peaking power transistor IC(s) may be twice the size of the main power transistor IC(s) so that the peaking power transistor IC(s) have twice the current carrying capability of the main power transistor IC(s). Peaking-to-main amplifier IC size ratios other than a 2:1 ratio may be implemented, as well.

During operation of Doherty amplifier 300, the main amplifier 340 is biased to operate in class AB mode, and the peaking amplifier 341 is biased to operate in class C mode. At low power levels, where the power of the input signal at node 302 is lower than the turn-on threshold level of peaking amplifier 341, the amplifier 300 operates in a low-power (or back-off) mode in which the main amplifier 340 is the only amplifier supplying current to the load 390. When the power of the input signal exceeds a threshold level of the peaking amplifier 341, the amplifier 300 operates in a high-power mode in which the main amplifier 340 and the peaking amplifier 341 both supply current to the load 390. At this point, the peaking amplifier 341 provides active load modulation at combining node 380, allowing the current of the main amplifier 340 to continue to increase linearly.

Input and output impedance matching networks 310, 350 (input MNm, output MNm) may be implemented at the input and/or output of the main amplifier 340. Similarly, input and output impedance matching networks 311, 351 (input MNp, output MNp) may be implemented at the input and/or output of the peaking amplifier 341. In each case, the matching networks 310, 311, 350, 351 may be used to incrementally increase the circuit impedance toward the load impedance and source impedance. As discussed previously, in a particular embodiment, the input and output impedance matching networks 310, 311, 350, 351 each may have a T-match circuit topology that includes a quasi cold point node (e.g., node 118, 158, FIG. 1). Baseband termination circuits 360, 361, 362, 363 (e.g., BBT circuits 160-161, FIG. 1) may be coupled between these quasi cold point nodes and the ground reference. All or portions of the input and output impedance matching networks 310, 311, 350, 351 and the baseband termination circuits 360-363 may be implemented inside a power transistor package that includes the main and/or peaking amplifiers 340, 341.

In addition, embodiments of the inventive subject matter include harmonic frequency termination circuits 330, 331 coupled between the inputs of amplifiers 340, 341 and a ground reference. The harmonic frequency termination circuits 330, 331, are configured to control the harmonic impedance across a relatively wide fractional bandwidth. For example, the harmonic frequency termination circuits 330, 331, may provide a low impedance path to ground for signal energy at the second harmonic of the center frequency of operation, $2f_o$, of the amplifier 300.

Doherty amplifier 300 has a "non-inverted" load network configuration. In the non-inverted configuration, the input circuit is configured so that an input signal supplied to the peaking amplifier 341 is delayed by 90 degrees with respect to the input signal supplied to the main amplifier 340 at the center frequency of operation, $f_o$, of the amplifier 300. To ensure that the main and peaking input RF signals arrive at the main and peaking amplifiers 340, 341 with about 90 degrees of phase difference, as is fundamental to proper Doherty amplifier operation, phase delay element 382 applies about 90 degrees of phase delay to the peaking input signal. For example, phase delay element 382 may include a quarter wave transmission line, or another suitable type of delay element with an electrical length of about 90 degrees.

To compensate for the resulting 90 degree phase delay difference between the main and peaking amplifier paths 320, 321 at the inputs of amplifiers 340, 341 (i.e., to ensure that the amplified signals arrive in phase at the combining node 380), the output circuit is configured to apply about a 90 degree phase delay to the signal between the output of main amplifier 340 and the combining node 380. This is achieved through an additional delay element 384. Alternate embodiments of Doherty amplifiers may have an "inverted" load network configuration. In such a configuration, the input circuit is configured so that an input signal supplied to the main amplifier 340 is delayed by about 90 degrees with respect to the input signal supplied to the peaking amplifier 341 at the center frequency of operation, $f_o$, of the amplifier 300, and the output circuit is configured to apply about a 90 degree phase delay to the signal between the output of peaking amplifier 341 and the combining node 380.

Amplifiers 340 and 341, along with harmonic frequency termination circuits 330, 331, and all or portions of matching networks 310, 311, 350, 351 and baseband termination circuits 360-363 may be implemented in discrete, packaged power amplifier devices. In such devices, input and output leads are coupled to a substrate, and each amplifier 340, 341 may include a single-stage or multi-stage power transistor also coupled to the substrate. Portions of the harmonic frequency termination circuits 330, 331, and the input and output matching networks 310, 311, 350, 351 may be implemented as additional components within the packaged device. Further, as is described in detail below, portions of the baseband termination circuits 360-363 (e.g., embodiments of baseband termination circuits 160-161, FIG. 1, illustrated in FIG. 2) also may be implemented as additional components within the packaged device.

The LC resonator has been included in the baseband termination circuit to increase the baseband impedance at RF frequencies. However, the LC resonator can cause high currents to circulate making the part less rugged and harder to manage the heat/current. It has been found that with just about 1.1 $A_{rms}$ flowing into the baseband termination circuit and with a current of about 16.3 $A_{rms}$ flowing into the output T match cap, a current of about 17.7 $A_{rms}$ of RF current flows between the resonator inductor and capacitor. One approach to overcome this problem of high current in the resonator includes increasing the inductance and decreasing the capacitance, but keeping the resonate frequency $f_{res}$ the same. This reduces the circulating currents. However, the disparity between the large inductor and small capacitor make for a difficult implementation and results in more sensitivity in the $f_{res}$.

Figure 4:
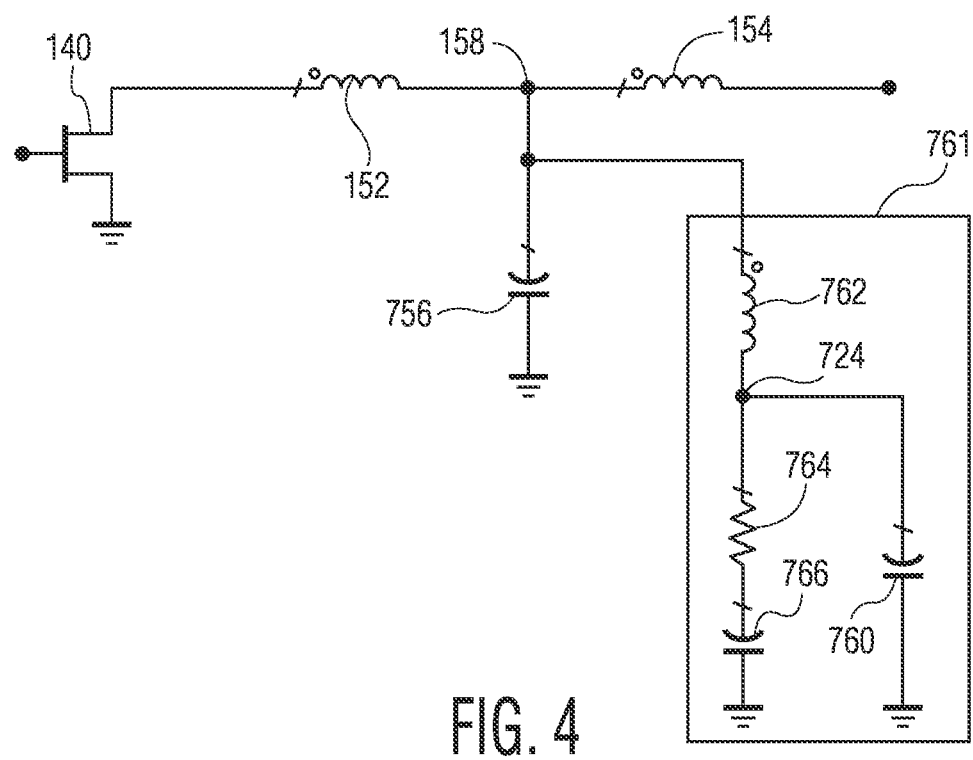
FIG. 4 illustrates a first embodiment of a baseband termination circuit.

FIG. 4 illustrates a first embodiment of a baseband termination circuit that reduces the current through its components. FIG. 4 illustrates only a portion of the RF power amplifier circuit in order to demonstrate the first embodiment of the baseband termination circuit. In FIG. 4, the transistor 140 and an output impedance T-matching circuit including inductive elements 152, 154 and the shunt capacitance 756 are illustrated. Each of these elements operates as described above as shown in FIG. 1 and may have the range of values as described above. The baseband termination circuit 761 includes inductance 762, resistor 764, and capacitors 760 and 766. The baseband termination circuit 761 is connected to node 158. The inductance 762, resistor 764, and capacitor 766 are connected in series between the node 158 and ground. The capacitor 760 is connected between a node 724 and ground. The node 724 is located between the inductance 762 and resistor 764. Further, the capacitor 760 is connected in parallel to the series connected resistor 764 and capacitor 766. The inductance 762 may have a value in the range between about between about 20 pH to about 3 nH, and shunt capacitance 156 may have a capacitance value in a range between about 10 pF to about 140 pF, although these component values may be smaller and/or larger, as well. In any event, the value of shunt capacitance 156 is selected to provide an acceptable RF low-impedance point at node 158. The capacitor 766 may be in the range between about between about 1 nF to about 15 nF. The capacitor 760 may be in the range between about between about 100 pF to 400 pF. The resistor 764 may be in the range between about between about 0.1 ohm to 6 ohm. The inductance 762, capacitors 760, 766, and/or resistor 764 may have values outside of the above-given ranges, as well.

Figure 5:
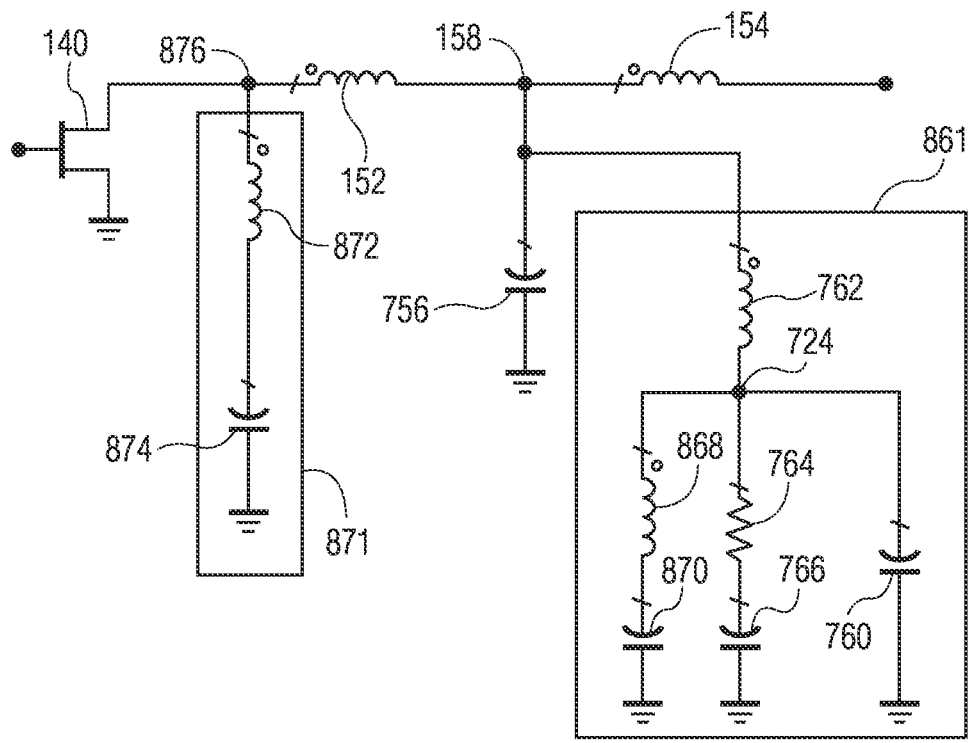
FIG. 5 illustrates a second embodiment of a baseband termination circuit.

FIG. 5 illustrates a second embodiment of a baseband termination circuit that reduces the current through its components. The second embodiment adds a few elements to the first embodiment. The second embodiment has the same T-match structure. A $2f_o$ harmonic trap circuit 871 is added to the circuit. The harmonic trap circuit 871 includes an inductance 872 and capacitance 874 connected in series between a node 876 and ground. The node 876 is between the output (e.g., drain) of transistor 140 and inductance 152. The harmonic trap circuit 871 shunts signal harmonics with energy at or near a frequency of $2 \times f_o$ to ground in order to improve the performance of the RF power amplifier.

In FIG. 5, the baseband termination circuit 861 is identical to the baseband termination circuit 761 of FIG. 4 except for the addition of a very low frequency termination circuit. The very low frequency termination circuit includes an inductance 868 and a capacitor 870 connected in series between the node 724 and ground. This very low frequency termination circuit shunts low frequencies to ground. The inductance values of inductances 872 and 868 and capacitors 874 and 870 are selected to achieve the desired low resonant frequency values below the signal frequency band. The inductance 868 and capacitor 870 may be implemented "off chip" in order to achieve the component parameter values needed to implement the very low frequency termination circuit.

The first and second embodiments of the baseband termination circuit were simulated and compared to the prior designs. It is noted that the low frequency performance in the 0 to 500 MHz range and in the 3.5 GHz range (a common frequency used by RF amplifiers) of the first and second embodiments of the baseband termination circuit were similar to the performance of the prior designs. At low frequency operation, the capacitor 760 presents a large impedance at node 724 as compared to the resistor 764 and capacitor 766 in series. As a result the baseband termination circuit looks like a resistor-inductor-capacitor (RLC) circuit formed of the resistor 764, inductance 762, and capacitor 766 where the capacitor 766 also presents a large impedance. At an operating frequency of 3.5 GHz the capacitor 760 presents a low impedance as compared to the resistor 764 and capacitor 766 in series and creates an RF cold point at node 724. This RF cold point isolates the baseband components from the rest of circuit and creates a low impedance path to ground at node 724, coupling inductor 762 between node 158 and ground. Thus, the inductor 762 is used for both baseband and RF matching. At an operating frequency of 3.5 GHz, the capacitor 756 and inductor 762 essentially form a parallel LC circuit to ground. In order for circuit 150 to operate as a T-match circuit, the matching capacitor 156 in parallel with the inductor 762 are designed to look capacitive at the operating frequency, and the resonance of these two elements must be below the RF band.

In the simulation the current through the capacitor 756 was about 25 $A_{rms}$. This lead to a current of about 9.3 $A_{rms}$ through the capacitor 760 and a current of about 1.8 $A_{rms}$ through the resistor 764 and the capacitor 766. As result, the currents present in the baseband termination circuit drop to more manageable levels. Further, the IPD implementation also allows for improved current handling.

Figure 6:
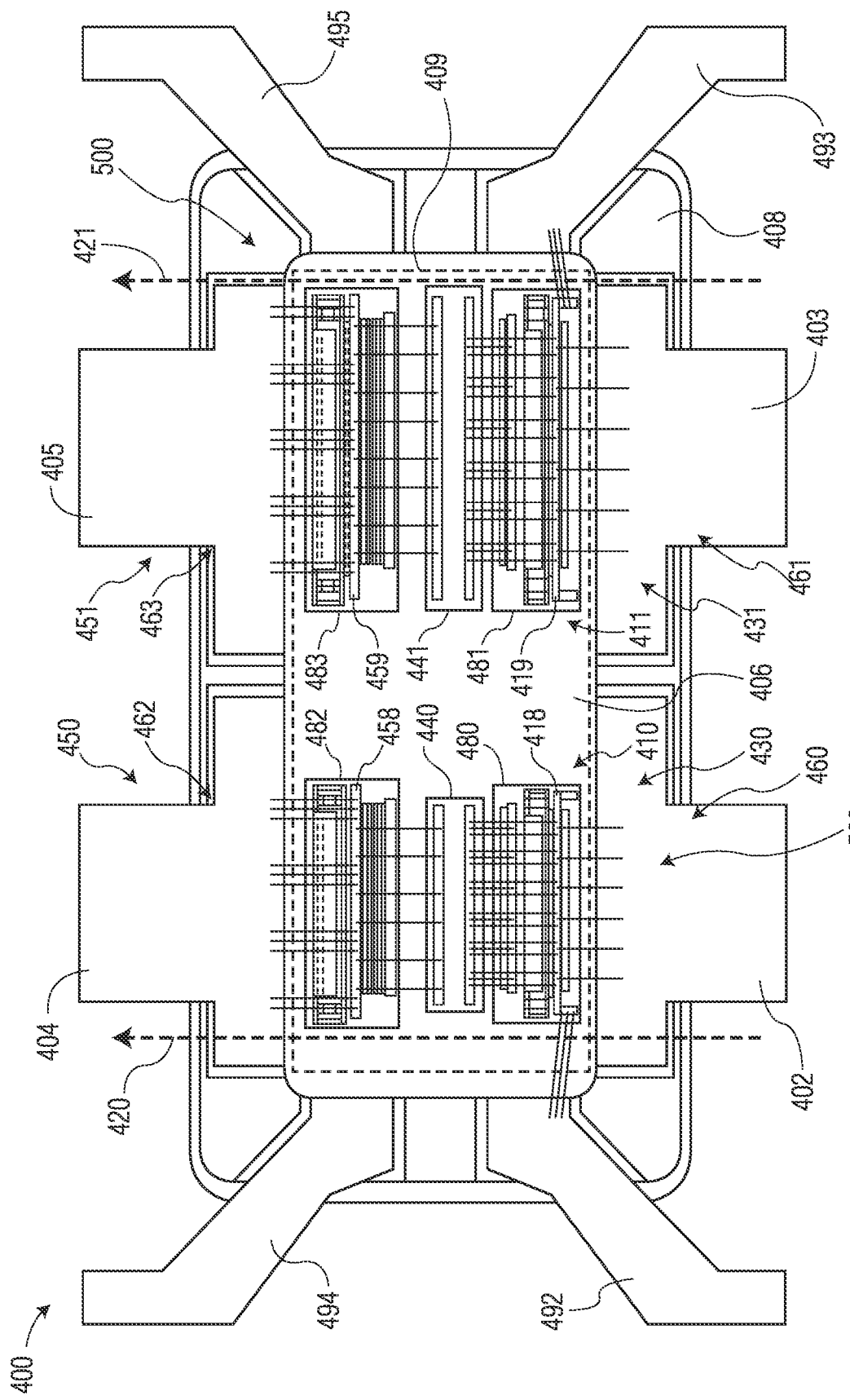
FIG. 6 is a top view of a packaged RF power amplifier device that includes two parallel amplification paths, in accordance with an example embodiment.
Figure 7:
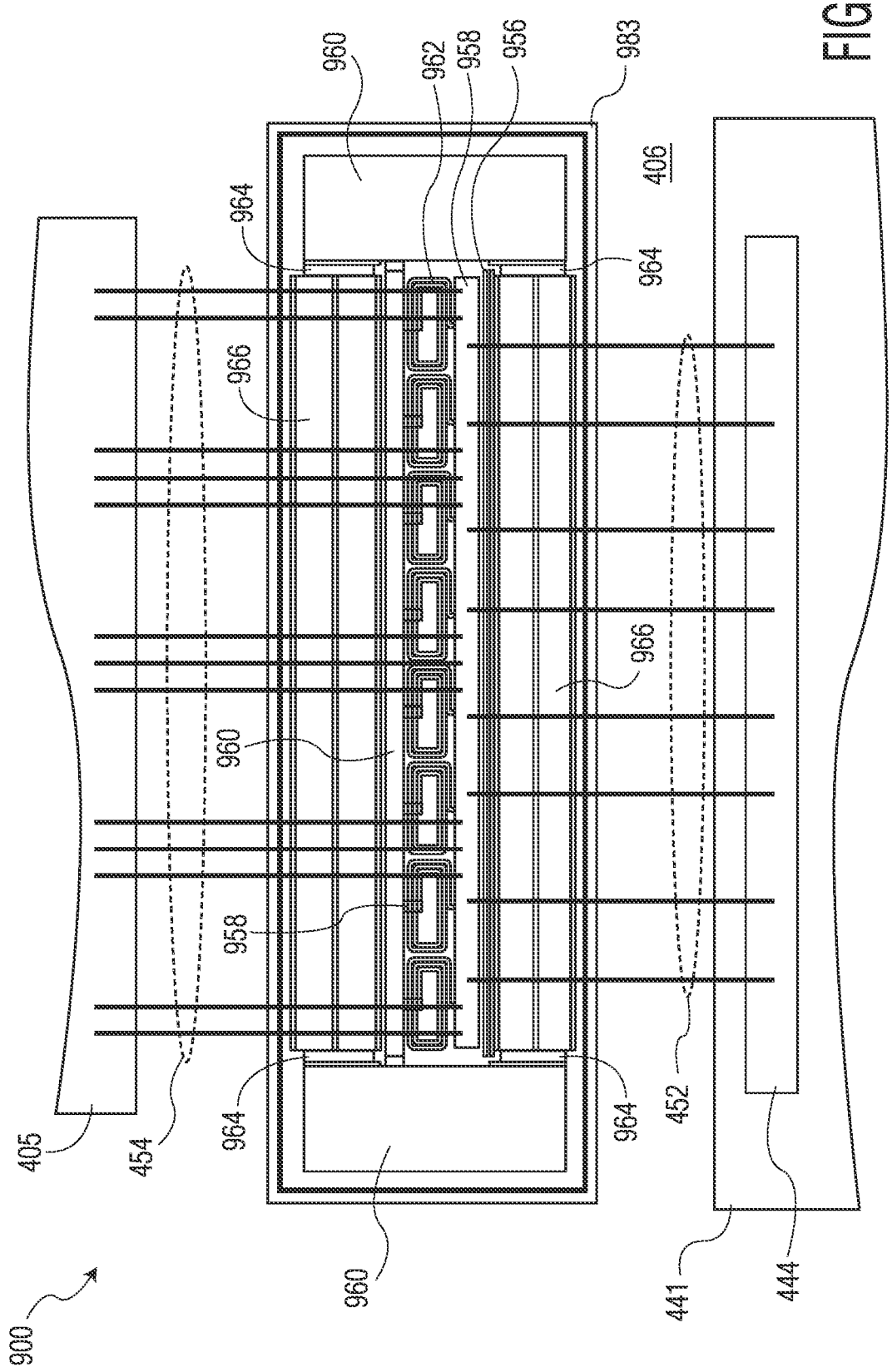
FIGS. 7 and 8 illustrate a first implementation of the baseband circuit of FIG. 4.
Figure 8:
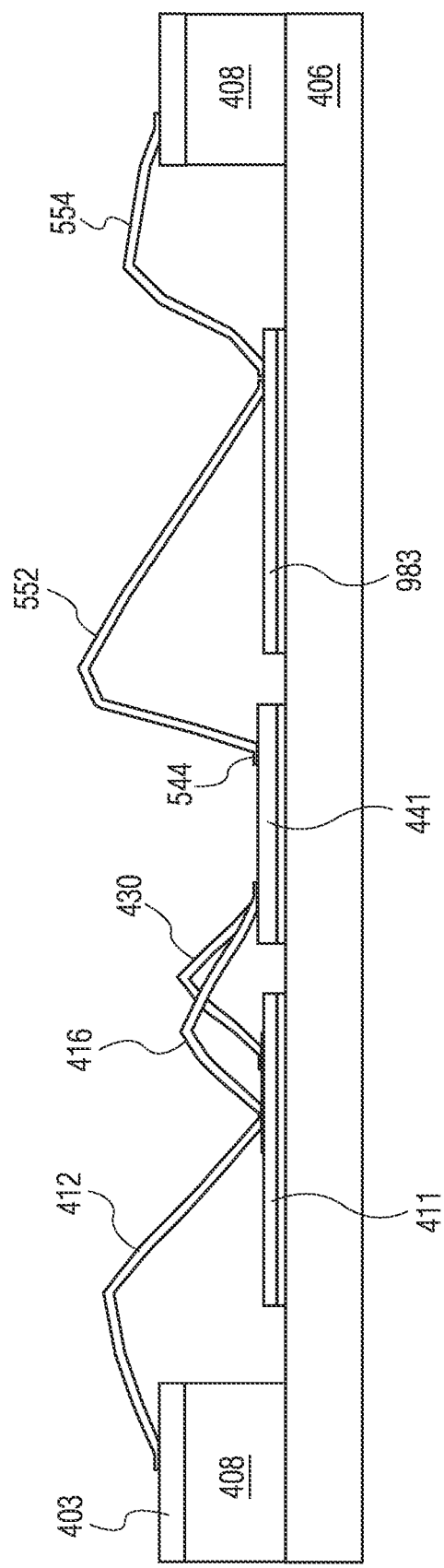

FIGS. 6-8 illustrate embodiments of RF amplifier devices that include input and output leads coupled to a substrate (e.g., with intervening electrical isolation), and a transistor die also coupled to the substrate between the input and output leads. Such RF amplifier devices may be particularly well suited for high-power amplification. Those of skill in the art would understand, based on the description herein, that the various embodiments may be implemented using different forms of packaging or construction, as well. For example, one or multiple amplification paths that include embodiments of the inventive subject matter could be coupled to a substrate such as a PCB, a no-leads type of package (e.g., a quad-flat no-leads (QFN) package), or another type of package. In such embodiments, inputs and outputs of the amplification path(s) could be implemented using conductive lands or other input/output (I/O) structures. Such implementations may be particularly suitable for lower-power amplification systems, for example, including a relatively low-power Doherty amplifier in which main and peaking amplification paths (including bare transistor dies, IPDs, bias circuits, and so on), a power divider, delay and impedance inversion elements, a combiner, and other components may be coupled to the substrate. It should be understood that implementations of the inventive subject matter are not limited to the illustrated embodiments.

For example, FIG. 6 is a top view of an embodiment of a packaged RF amplifier device 400 that embodies two parallel instances of the circuit 100 of FIG. 1, and which may be utilized to provide amplifiers (e.g., amplifiers 340, 341, FIG. 3), and portions of matching networks (e.g., portions of matching networks 310, 311, 350, 351, FIG. 3) in a Doherty amplifier (e.g., Doherty amplifier 300, FIG. 3). In addition, as will be described in more detail below, device 400 includes two input-side IPD assemblies 480, 481, each of which includes portions of an input impedance matching circuit 410, 411 (e.g., circuit 110, 310, 311 FIGS. 1, 3), a baseband termination circuit 460, 461 (e.g., circuit 160, 360, 361, FIGS. 1, 3), and a harmonic termination circuit 430, 431 (e.g., circuit 130, 330, 331, FIGS. 1, 3). Further, device 400 includes two output-side IPD assemblies 482, 483, each of which includes portions of an output impedance matching circuit 450, 451 (e.g., circuit 150, 350, 351 FIGS. 1, 3), and a baseband termination circuit 462, 463 (e.g., circuit 161, 362, 363, FIGS. 1, 3).

Device 400 includes a flange 406 (or "device substrate"), in an embodiment, which includes a rigid electrically-conductive substrate with a thickness that is sufficient to provide structural support for various electrical components and elements of device 400. In addition, flange 406 may function as a heat sink for transistor dies 440, 441 and other devices mounted on flange 406. Flange 406 has top and bottom surfaces (only a central portion of the top surface is visible in FIG. 6), and a substantially-rectangular perimeter that corresponds to the perimeter of the device 400.

Flange 406 is formed from an electrically conductive material, and may be used to provide a ground reference node for the device 400. For example, various components and elements may have terminals that are electrically coupled to flange 406, and flange 406 may be electrically coupled to a system ground when the device 400 is incorporated into a larger electrical system. At least the top surface of flange 406 is formed from a layer of conductive material, and possibly all of flange 406 is formed from bulk conductive material.

An isolation structure 408 is attached to the top surface of flange 406, in an embodiment. isolation structure 408, which is formed from a rigid, electrically insulating material, provides electrical isolation between conductive features of the device (e.g., between leads 402-405 and flange 406).

Isolation structure 408 has a frame shape, in an embodiment, which includes a substantially enclosed, four-sided structure with a central opening. Isolation structure 408 may have a substantially rectangular shape, as shown in FIG. 6, or isolation structure 408 may have another shape (e.g., annular ring, oval, and so on).

A portion of the top surface of flange 406 that is exposed through the opening in isolation structure 408 is referred to herein as the "active area" of device 400. Transistor dies 440, 441 are positioned within the active device area of device 400, along with IPD assemblies 480, 481, 482, 483, which will be described in more detail later. For example, the transistor dies 440, 441 and IPD assemblies 480-483 may be coupled to the top surface of flange 406 using conductive epoxy, solder, solder bumps, sintering, and/or eutectic bonds.

Device 400 houses two amplification paths (indicated with arrows 420, 421), where each amplification path 420, 421 represents a physical implementation of circuit 100 (FIG. 1). When incorporated into a Doherty amplifier (e.g., Doherty amplifier 300, FIG. 3), amplification path 420 may correspond to a main amplifier path (e.g., main amplifier path 320, FIG. 3), and amplification path 421 may correspond to a peaking amplifier path (e.g., peaking amplifier path 321, FIG. 3).

Each path 420, 421 includes an input lead 402, 403 (e.g., input 102, FIG. 1), an output lead 404, 405 (e.g., output 104, FIG. 1), one or more transistor dies 440, 441 (e.g., transistor 140, FIG. 1 or amplifiers 340, 341, FIG. 3), an input impedance matching circuit 410, 411 (e.g., input impedance matching circuit 110, FIG. 1 or portions of input matching networks 310, 311, FIG. 3), an output impedance matching circuit 450, 451 (e.g., output impedance matching circuit 150, FIG. 1 or portions of output matching networks 350, 351, FIG. 3), an input-side baseband termination circuit 460, 461 (e.g., baseband termination circuit 160, 360, 361, FIGS. 1, 3), output-side baseband termination circuits 462, 463, 464, 465 (e.g., baseband termination circuits 161, 362, 363, FIGS. 1, 3), and an input-side harmonic termination circuit 430, 431 (e.g., harmonic termination circuit 130, 330, 331, FIGS. 1, 3).

The input and output leads 402-405 are mounted on a top surface of the isolation structure 408 on opposed sides of the central opening, and thus the input and output leads 402-405 are elevated above the top surface of the flange 406, and are electrically isolated from the flange 406. Generally, the input and output leads 402-405 are oriented to allow for attachment of wirebonds between the input and output leads 402-405 and components and elements within the central opening of isolation structure 408.

Each transistor die 440, 441 includes an integrated power FET, where each FET has a control terminal (e.g., a gate) and two current conducting terminals (e.g., a drain and a source). A control terminal of a FET within each transistor die 440, 441 is coupled through an input impedance matching circuit 410, 411 to an input lead 402, 403. In addition, one current conducting terminal (e.g., the drain) of a FET within each transistor die 440, 441 is coupled through an output impedance matching circuit 450, 451 to an output lead 404, 405. The other current conducting terminal (e.g., the source) of a FET within each transistor die 440, 441 is electrically coupled through the die 440, 441 to the flange 406 (e.g., to ground), in an embodiment.

Embodiments of the input impedance matching circuits 410, 411, baseband termination circuits 460, 461, and harmonic termination circuits 430, 431 are not discussed in detail herein. Suffice it to be said that some of the components of these circuits may be implemented within IPD assemblies 480, 481. Briefly, each input impedance matching circuit 410, 411 is coupled between an input lead 402, 403 and the control terminal of a FET within a transistor die 440, 441. Each input-side baseband termination circuit 460, 461 is coupled between a node 418, 419 (e.g., a conductive bond pad corresponding to node 118, FIG. 1) within IPD assembly 480, 481 and a ground reference (e.g., flange 406). Each harmonic termination circuit 430, 431 is coupled between the control terminal (e.g., the gate) of a FET within a transistor die 440, 441 and the ground reference (e.g., flange 406).

Embodiments of the output impedance matching circuits 450, 451 and baseband termination circuits 462, 463 will be described in more detail in conjunction with FIGS. 7 and 8, which illustrate the components of these circuits 450, 451, 462, 463, in greater detail. As will be explained in conjunction with FIGS. 7 and 8, some of the components of these circuits may be implemented within IPD assemblies 482, 483. Briefly, each output impedance matching circuit 450, 451 is coupled between a current conducting terminal (e.g., the drain) of a FET within a transistor die 440, 441 and an output lead 404, 405. Each baseband termination circuit 462, 463 is coupled between a node 458, 459 (e.g., an RF low-impedance point (or a quasi RF cold point node) in the form of a conductive bond pad corresponding to node 158, FIG. 1) within IPD assembly 482, 483 and a ground reference (e.g., flange 406).

In the example of FIG. 6, device 400 includes two transistor dies 440, 441 that essentially function in parallel, although another semiconductor device may include a single transistor die or more than two transistor dies, as well. In addition, device 400 includes two input-side IPD assemblies 480, 481 and two output-side IPD assemblies 482, 483, which also essentially function in parallel. It is to be understood that more or fewer of IPD assemblies 480-483 may be implemented, as well.

According to an embodiment, device 400 is incorporated in an air cavity package, in which transistor dies 440, 441, the IPD assemblies 480-483, and various other components are located within an enclosed air cavity. Basically, the air cavity is bounded by flange 406, isolation structure 408, and a cap (not shown) overlying and in contact with the isolation structure 408 and leads 402-405. In FIG. 6, an example perimeter of the cap is indicated by dashed box 409. In other embodiments, the components of device 400 may be incorporated into an overmolded package (i.e., a package in which the electrical components within the active device area are encapsulated with a non-conductive molding compound, and in which portions of the leads 402-405 also may be encompassed by the molding compound). In an overmolded package, isolation structure 408 may be excluded.

FIGS. 7 and 8 illustrate a first implementation of the baseband circuit of FIG. 4. For enhanced understanding, FIG. 8 includes a cross-sectional, side view of the RF power amplifier device of FIG. 6, in accordance with an example embodiment.

As is most clearly illustrated in FIG. 8, the power transistor die 441 and the IPD assembly 983 are coupled to the top surface of the conductive flange 406, and the output lead 405 is electrically isolated from the conductive flange 406 (e.g., using isolation structure 408). Power transistor die 441 includes a transistor output terminal (e.g., a conductive bond pad), which is electrically connected within power transistor die 441 to a first current-conducting terminal (e.g., a drain terminal) of a single-stage or final-stage FET integrated within the die 441. As discussed previously, each FET may include a III-V field effect transistor (e.g., a HEMT), such as a GaN FET (or another type of III-V transistor, including a GaAs FET, a GaP FET, an InP FET, or an InSb FET). More specifically, each FET may be integrally formed in and on a base semiconductor substrate (e.g., a GaN substrate, a GaN-on-silicon substrate, a GaN-on-silicon carbide substrate, and so on).

The IPD assembly 983 also may include a base semiconductor substrate (e.g., a silicon substrate, a silicon carbide substrate, a GaN substrate, or another type of semiconductor substrate, which may be referred to as an "IPD substrate" herein) and a build-up structure of alternating dielectric and patterned conductive layers, where portions of the patterned conductive layers are electrically connected using conductive vias. As will be discussed in more detail below, various electrical components of the baseband termination circuit 761 are integrally formed within and/or connected to the IPD assembly 983. These electrical components may be electrically connected to conductive bond pads at the top surface of the IPD assembly 983, and also may be electrically connected to the conductive flange 406 (e.g., to ground) using through substrate vias to a conductive layer on a bottom surface of the IPD assembly 983.

In some embodiments, the output-side IPD assembly 983 more specifically includes a capacitor 956 (e.g., capacitance 756, FIG. 4) of an output impedance matching circuit and components of an baseband termination circuit (e.g., circuit 761, FIG. 4). In the embodiments of FIGS. 7 and 8, the components of the baseband termination circuit included in IPD assembly 983 more specifically include an resistor 964 (e.g., resistor 764, FIG. 4), an inductor 962 (e.g., inductor 762, FIG. 4), a capacitor 966 (e.g., capacitor 766, FIG. 4), and a capacitor 960 (e.g., capacitor 760, FIG. 4). Each of these components will be discussed in more detail later.

First, connections between the transistor die 441 and the output lead 405 through the output impedance matching circuit will be described in more detail. More specifically, through the output terminal 444, the first current conducting terminal (e.g., the drain) of a FET within transistor die 441 is electrically coupled to output lead 405 through an instance of an output impedance matching circuit. For example, in an embodiment, output impedance matching circuit has a T-match configuration, which includes two inductive elements 452, 454 (e.g., inductive elements 152, 154, FIG. 4) coupled in series, and a capacitor 956 (e.g., capacitance 756, FIG. 4). A first inductive element 452 (e.g., inductive element 152, FIG. 4) may be implemented as a first set of wirebonds that is coupled between the output terminal 444 of die 441 and a conductive bond pad 958 on a top surface of the IPD assembly 983. A second inductive element 454 (e.g., inductive element 154, FIG. 4) may be implemented as a second set of wirebonds that is coupled between the conductive bond pad 958 and output lead 405. According to an embodiment, wirebond arrays 452, 454 each may have an inductance value in a range between about 20 pH to about 3 nH, although their inductance values may be lower or higher, as well.

According to an embodiment, the capacitor 956 of output impedance matching circuit may be implemented as a capacitor (or a set of parallel-coupled capacitors) that is integrally formed with the IPD substrate of IPD assembly 983. For example, capacitor 956 may be implemented as one or more integrated MIM capacitors, which include first and second conductive electrodes that are aligned with each other and electrically separated by a dielectric material. A first electrode (or terminal) of capacitor 956 is electrically coupled to the conductive bond pad 958 (and thus to wirebonds 452 and 454), and a second electrode (or terminal) of each capacitor 956 is electrically coupled to the conductive flange (e.g., using conductive through substrate vias that extend through the semiconductor substrate), in an embodiment. In a more specific embodiment, the first electrode of the capacitor 956 is "directly connected" to the bond pad 958, where "directly connected" means electrically connected, possibly with one or more conductive traces and/or conductive vias, but without intervening circuit elements (i.e., circuit elements that have more than a trace inductance, where a "trace inductance" is an inductance less than about 100 pH). Because the capacitor 956 and the bond pad 958 are "directly connected," and the bond pad 958 also has only a trace inductance, in an embodiment, the wirebonds 452, 454 and the capacitor 956 also may be considered to be "directly connected." In an alternate embodiment, the capacitor 956 may be implemented using a discrete capacitor coupled to a top surface of the IPD assembly 983, or using another type of capacitor. According to an embodiment, shunt capacitor 956 may have a capacitance value in a range between about 10 pF to about 140 pF, although the capacitance value may be lower or higher, as well.

As discussed previously in conjunction with FIG. 1, the T-match configuration formed by inductors 452, 454 and capacitor 956 may function as a low-pass matching stage. Further, the conductive bond pad 958 to which wirebonds 452 and 454 are coupled may correspond to an RF low-impedance point node, or a "quasi RF cold point node" (e.g., node 158, FIG. 4), in an embodiment.

The baseband termination circuit 761 is included in IPD assembly 983, in an embodiment. The baseband termination circuit includes inductance 962 (i.e., inductance 762 of FIG. 4), resistor 964 (i.e., resistor 764 of FIG. 4), and capacitors 960 and 966 (i.e., capacitors 760 and 766 of FIG. 4). The baseband termination circuit is connected to node 158 as before. The inductance 962, resistor 964, and capacitor 966 are connected in series between the node 158 and ground. The capacitor 960 is connected between a node (i.e., 724 in FIG. 5) and ground. The node is located between the inductance 962 and resistor 964. Further, the capacitor 960 is connected in parallel to the series connected resistor 964 and capacitor 966.

The inductance 962 may be integrally formed as part of the IPD assembly 983, as is illustrated in the embodiment of FIGS. 7 and 8. For example, inductance 962 may be provided by a plurality of patterned conductors formed from portion(s) of one or more conductive layers of the build-up structure, where a first end of the conductor is electrically coupled to resistor 964, and a second end of the conductor is electrically coupled to bond pad 958. In alternate embodiments, the inductance 962 may be implemented as a discrete inductor coupled to a top surface of IPD assembly 983. Further, multiple instances of the inductance 962 in parallel are implemented on the IPD assembly 983. In an alternate embodiment, the baseband termination circuit may include fewer or more instances of the inductance 962.

Further, the capacitor 960 is formed in thee portions: a central portion connecting two portions on the side. This allows for a larger capacitor 960 that is capable of handling higher currents that may be present in the capacitor 960 as described above.

In the embodiments of FIGS. 7 and 8, resistor 964 is integrally formed as part of the IPD assembly 983 in four parallel instances. For example, each resistor 964 may be a polysilicon resistor formed from a layer of polysilicon on or within a build-up structure. In other alternate embodiments, the envelope resistor 964 may be formed from tungsten silicide or another material, may be a thick or thin film resistor, or may be a discrete component coupled to a top surface of IPD assembly 983.

The envelope capacitor 966 is electrically coupled between a ground reference node (e.g., conductive layer at the bottom surface of each IPD assembly 983) and the resistor 964. Capacitor 966 may be a MIM capacitor that is integrally formed with the IPD substrate of IPD assembly 983, for example. In some embodiments, capacitor 966 may be formed in the build-up structure entirely above the semiconductor substrate, or capacitor 966 may have portions that extend into the semiconductor substrate or are otherwise coupled to, or in contact with, the semiconductor substrate. According to an embodiment, the capacitor 966 may be formed from a first electrode, a second electrode, and a dielectric material between the first and second electrodes. The dielectric material of capacitor 966 may include one or more layers of polysilicon, various oxides, a nitride, or other suitable materials. In various embodiments, the first and second electrodes of capacitor 966 may include horizontal portions of conductive layers (e.g., portions that are parallel to the top and bottom surfaces of IPD assembly 983) and/or vertical portions (e.g., portions that are parallel to the sides of IPD assembly 983) of conductive layers that are interconnected. Further, the first and second electrodes of capacitor 966 may be formed from metal layers and/or from conductive semiconductor materials (e.g., polysilicon). Alternatively, the capacitor 966 may be, for example, a discrete capacitor that is connected (e.g., using solder, a conductive epoxy, or other means) to a top surface of the IPD assembly 983. Although particular capacitor structures are shown in FIGS. 7 and 8 for capacitors 956, 960, and 966, a variety of other capacitor structures alternatively may be utilized, as would be understood by one of skill in the art based on the description herein.

Figure 9:
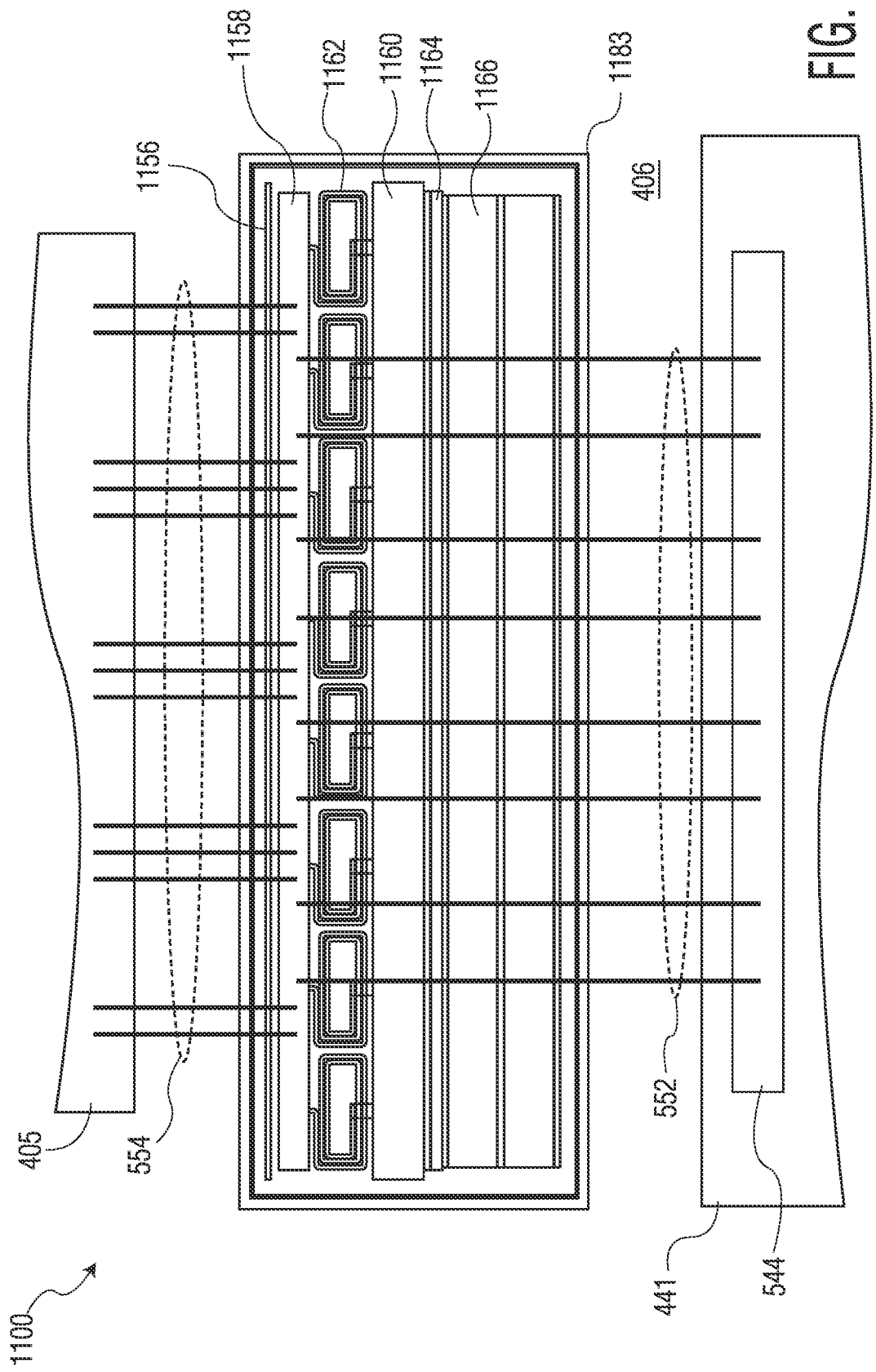
FIGS. 9 and 10 illustrate a second implementation of the baseband circuit of FIG. 4.
Figure 10:
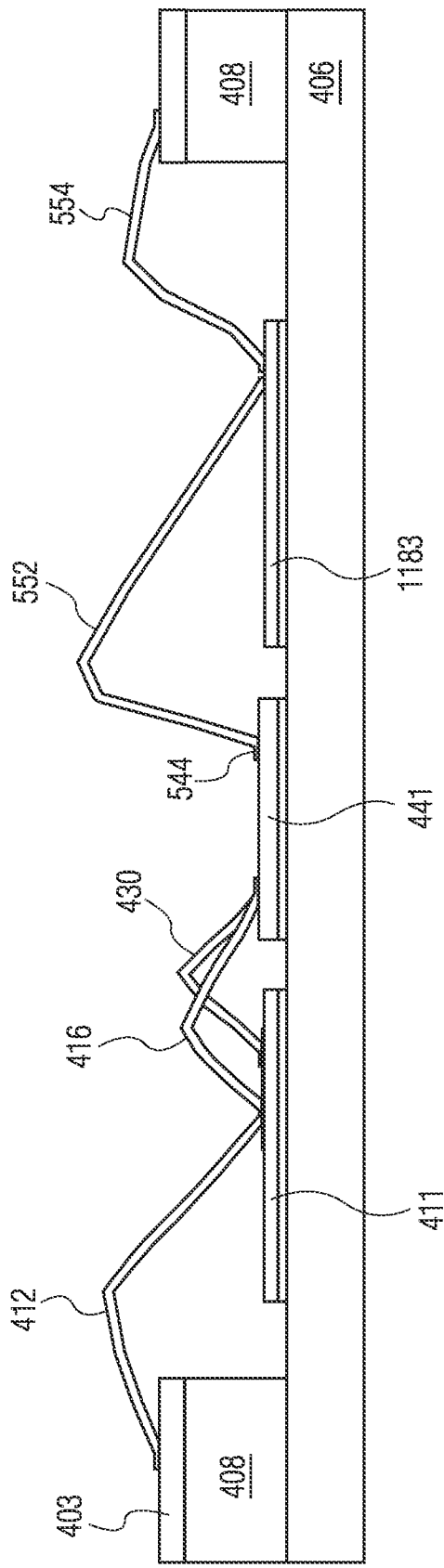

FIGS. 9 and 10 illustrate a second implementation of the baseband circuit of FIG. 4. The IPD 1183 and it related elements correspond to elements in FIG. 4 with similar numbers. The IPD 1183 lays out the various elements of FIG. 4 in a different way. The capacitor 1156 (i.e., capacitor 756 in FIG. 5) and the bond pad 1158 (corresponding to node 158 in FIG. 4) are near the top of the IPD 1183 as shown. Inductor 1162 is adjacent the bond pad 1158 in the layout of IPD 1183. Next, the capacitor 1160 is adjacent the inductor 1162 in the layout of IPD 1183. The resistor 1164 is then adjacent the capacitor 1160. Finally, the capacitor 1166 is adjacent the resistor 1164. The various elements are connected in order to implement the baseband circuit 761 of FIG. 4.

Figure 11:
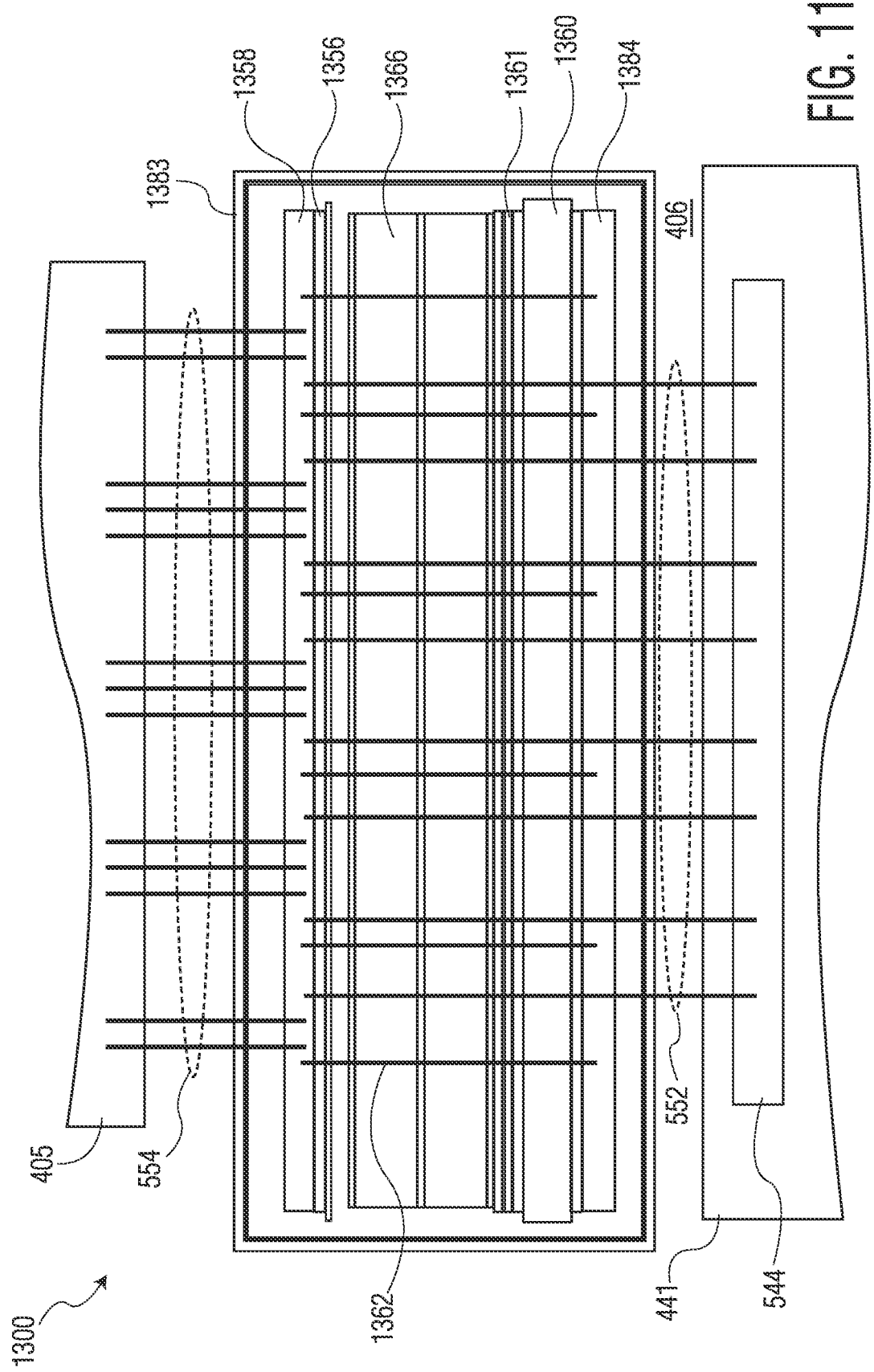
FIGS. 11 and 12 illustrate a third implementation of the baseband circuit of FIG. 4.
Figure 12:
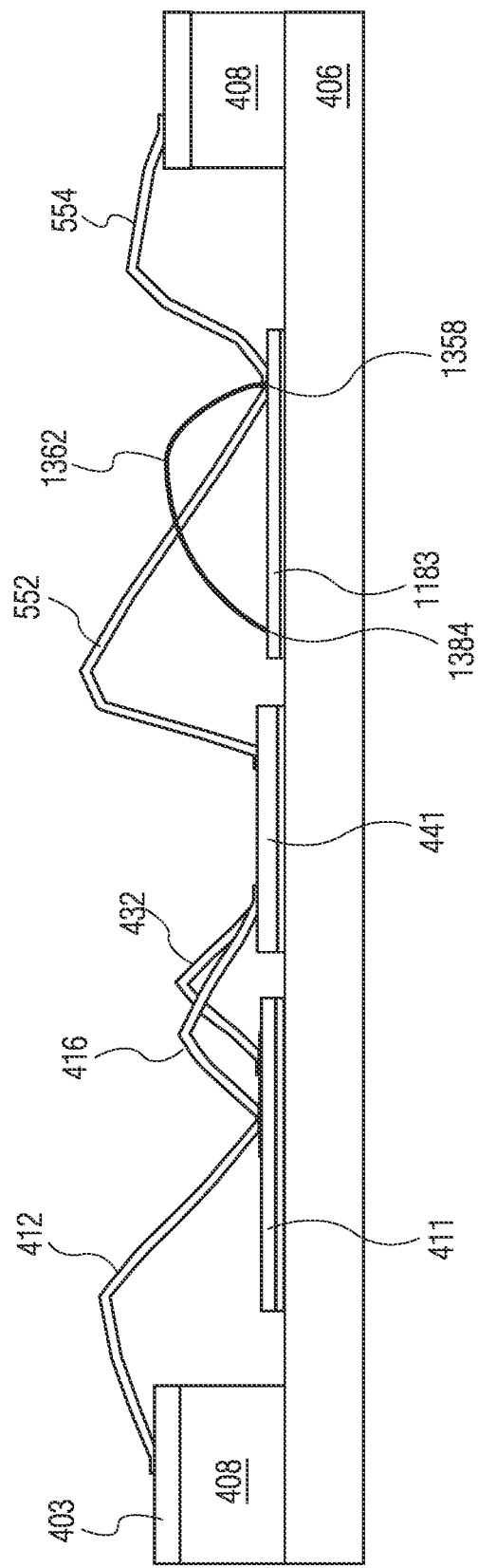

FIGS. 11 and 12 illustrate a third implementation of the baseband circuit of FIG. 4. The IPD 1383 and it related elements correspond to elements in FIG. 4 with similar numbers. The IPD 1383 lays out the various elements of FIG. 4 in a different way from that of FIGS. 7 and 11. The bond pad 1358 (corresponding to node 158 in FIG. 4) and capacitor 1356 (i.e., capacitor 756 in FIG. 5) are near the top of the IPD 1183 as shown. Next, the capacitor 1366 is adjacent the capacitor 1356 in the layout of IPD 1183. The resistor 1364 is then adjacent the capacitor 1366. The capacitor 1360 is adjacent the resistor 1364. Finally, a second bond pad 1358 is adjacent the capacitor 1360. Inductor 1362 is implemented as a series of wirebonds between bond pad 1358 and bond pad 1384 instead of a coil inductor as previously described. The various elements are connected in order to implement the baseband circuit 761 of FIG. 4.

FIGS. 7-12 illustrate embodiments of RF amplifier devices that include input and output leads coupled to a substrate (e.g., with intervening electrical isolation), and a transistor die also coupled to the substrate between the input and output leads. Such RF amplifier devices may be particularly well suited for high-power amplification. Those of skill in the art would understand, based on the description herein, that the various embodiments may be implemented using different forms of packaging or construction, as well. For example, one or multiple amplification paths that include embodiments of the inventive subject matter could be coupled to a substrate such as a PCB, a no-leads type of package (e.g., a quad-flat no-leads (QFN) package), or another type of package. In such embodiments, inputs and outputs of the amplification path(s) could be implemented using conductive lands or other input/output (I/O) structures. Such implementations may be particularly suitable for lower-power amplification systems, for example, including a relatively low-power Doherty amplifier in which main and peaking amplification paths (including bare transistor dies, IPDs, bias circuits, and so on), a power divider, delay and impedance inversion elements, a combiner, and other components may be coupled to the substrate. It should be understood that implementations of the inventive subject matter are not limited to the illustrated embodiments.

Figure 13:
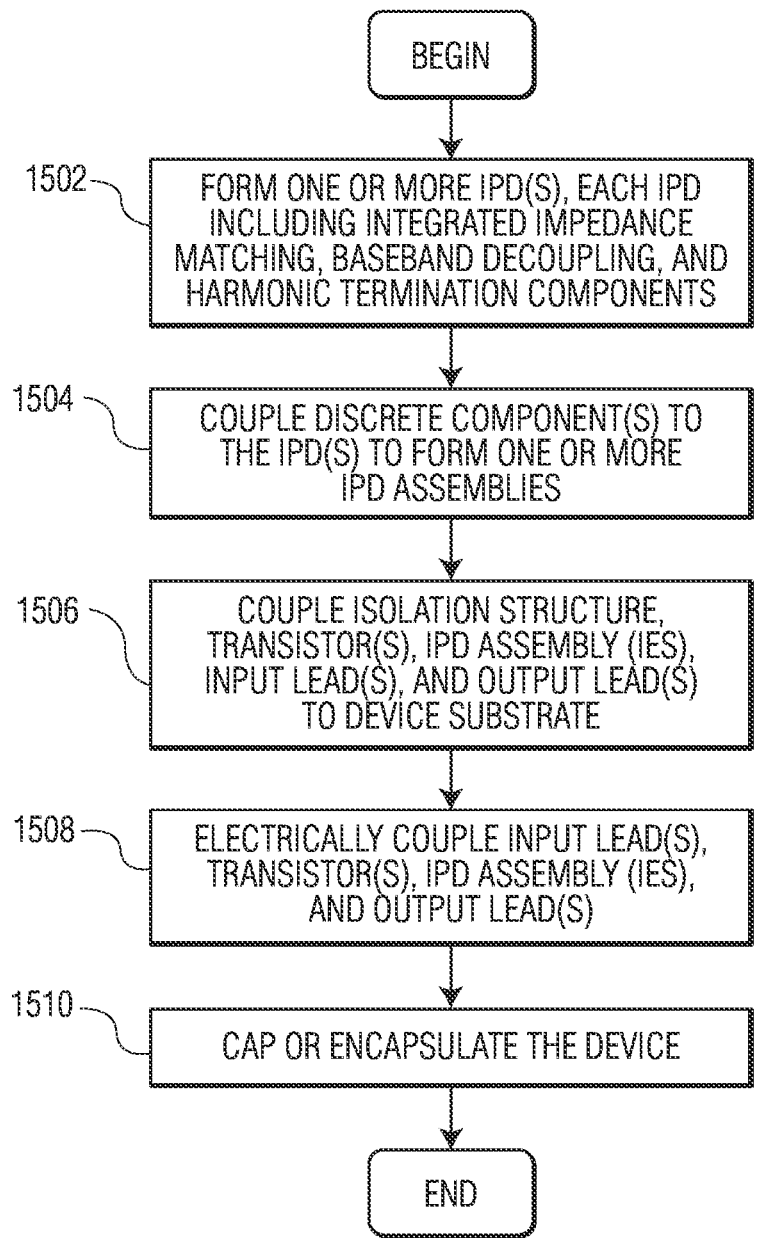
FIG. 13 is a flowchart of a method for fabricating a packaged RF power amplifier device that includes an embodiment of an output impedance matching circuit, in accordance with an example embodiment.

FIG. 13 is a flowchart of a method for fabricating a packaged RF power amplifier device (e.g., device 400, FIG. 6) that includes embodiments of input and output impedance matching circuits and baseband termination circuits (e.g., circuits 205, 410, 411, 430, 431, 450, 451, 460-463, 761, 861, FIGS. 2, 4, 7, 8), in accordance with various example embodiments. The method may begin, in blocks 1502-1504, by forming one or more IPD assemblies. More specifically, in block 1502, one or more input and output IPDs (e.g., IPDs 480-483, 983, 1183, 1383, FIGS. 4-6, 9-14) may be formed. According to an embodiment, each input IPD (e.g., IPDs 480, 481) may include components of an impedance matching circuit, a baseband termination circuit, and a harmonic termination circuit. According to an embodiment, each output IPD (e.g., IPDs 482, 483, 983, 1183, 1383) also may include components of an impedance matching circuit and a baseband termination circuit. For example, each output IPD may include one or more resistors, inductors, and capacitors as described above. In addition to forming the passive components of each IPD, forming each IPD also includes forming various conductive features (e.g., conductive layers and vias), which facilitate electrical connection between the various components of each circuit. For example, forming the IPDs also may include forming various accessible connection nodes at a surface of each IPD substrate. As discussed previously, the connection nodes may include conductive bond pads, which may accept attachment of inductive elements. In addition, in block 1504, discrete components corresponding to various circuit elements may be coupled to conductors exposed at the surface of each IPD to form one or more IPD assemblies.

In block 1506, for an air cavity embodiment, an isolation structure (e.g., isolation structure 408, FIG. 6) is coupled to a device substrate (e.g., flange 406). In addition, one or more active devices and IPD assemblies are coupled to a portion of the top surface of the substrate that is exposed through an opening in the isolation structure. Leads are coupled to the top surface of the isolation structure. For overmolded (e.g., encapsulated) device embodiments, the isolation structure may be excluded, and the substrate and leads may form portions of a leadframe.

In block 1508, the input lead(s), transistor(s), IPD assembly(ies), and output lead(s) are electrically coupled together. For example, the electrical connections may be made using wirebonds between the various device components and elements, as discussed previously. Some of the wirebonds correspond to inductive components of input or output matching circuits (e.g., wirebonds 452, 454, FIGS. 4-6, 9-14), for example. Finally, in block 1510, the device is capped (e.g., for an air cavity package) or encapsulated (e.g., with mold compound for an overmolded package). The device may then be incorporated into a larger electrical system (e.g., a Doherty amplifier or other type of electrical system).

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A radio frequency (RF) amplifier with a first amplification path that comprises:
    a transistor die with a transistor and a transistor output terminal;
    an output-side impedance matching circuit having a T-match circuit topology coupled between the transistor output terminal and an output of the first amplification path, wherein the output-side impedance matching circuit includes
        a first inductive element with a first terminal connected to the transistor output terminal, and a second terminal connected to a quasi RF cold point node,
        a second inductive element with a first terminal connected to the quasi RF cold point node, and a second terminal coupled to the output of the first amplification path, and
        a first capacitance with a first terminal connected to the quasi RF cold point node, and a second terminal coupled to a ground reference node; and
    a baseband termination circuit connected to the quasi RF cold point node, wherein the baseband termination circuit includes a plurality of components, wherein the plurality of components includes a third inductive element, a resistor, and a second capacitance in series between the quasi RF cold point node and the ground reference node, and a third capacitance between a baseband termination circuit node and the ground reference node, wherein the baseband termination circuit node is between the third inductive element and the resistor.

2. The RF amplifier of claim 1, wherein:
    the first inductive element includes a first plurality of wirebonds; and
    the second inductive element includes a second plurality of wirebonds.

3. A radio frequency (RF) amplifier with a first amplification path that comprises:
    a transistor die with a transistor and a transistor output terminal;
    an output-side impedance matching circuit having a T-match circuit topology coupled between the transistor output terminal and an output of the first amplification path, wherein the output-side impedance matching circuit includes
        a first inductive element connected between the transistor output terminal and a quasi RF cold point node,
        a second inductive element connected between the quasi RF cold point node and the output of the first amplification path, and
        a first capacitance connected between the quasi RF cold point node and a ground reference node;
    a baseband termination circuit connected to the quasi RF cold point node, wherein the baseband termination circuit includes a plurality of components, wherein the plurality of components includes a third inductive element, a resistor, and a second capacitance in series between the quasi RF cold point node and the ground reference node and a third capacitance between a baseband termination circuit node and the ground reference node, wherein the baseband termination circuit node is between the third inductive element and the resistor; and a low frequency termination circuit comprising a fourth inductive element and a fourth capacitance connected in series between the baseband termination circuit node and the ground reference node.

4. The RF amplifier of claim 3, wherein the low frequency termination circuit resonates at a frequency less than 500 MHz.

5. The RF amplifier of claim 3, further comprising:
a harmonic trap circuit comprising a fifth inductive element and a fifth capacitance connected in series between the transistor output terminal and the ground reference node, and the harmonic trap circuit resonates at a second harmonic frequency of a fundamental frequency of operation of the RF amplifier.

6. The RF amplifier of claim 1, wherein the transistor is a gallium nitride transistor with a drain-source capacitance below 0.2 picofarads per watt.

7. The RF amplifier of claim 1, wherein the RF amplifier is a Doherty power amplifier further comprising:
a second amplification path;
a power divider with a power divider input configured to receive an RF signal, a first power divider output coupled to an input of the first amplification path, and a second power divider output coupled to an input of the second amplification path, wherein the power divider is configured to divide the RF signal into a first RF signal that is provided to the first amplification path through the first power divider output, and into a second RF signal that is provided to the second amplification path through the second power divider output; and
a combining node configured to receive and combine amplified RF signals produced by the first and second amplification paths.

8. A packaged radio frequency (RF) amplifier device comprising:
a device substrate;
a first input lead coupled to the device substrate;
a first output lead coupled to the device substrate;
a first transistor die coupled to the device substrate, wherein the first transistor die includes a first transistor, a transistor input terminal coupled to the first input lead, and a transistor output terminal coupled to the first output lead, and wherein the first transistor has a drain-source capacitance below 0.2 picofarads per watt;
a first output-side impedance matching circuit having a T-match circuit topology coupled between the first transistor output terminal and the first output lead, wherein the first output-side impedance matching circuit includes
a first inductive element with a first terminal connected to the transistor output terminal, and a second terminal connected to a first quasi RF cold point node, wherein the first inductive element includes a first plurality of wirebonds,
a second inductive element with a first terminal connected to the first quasi RF cold point node, and a second terminal coupled to the first output lead, wherein the second inductive element includes a second plurality of wirebonds, and
a first capacitance with a first terminal connected to the first quasi RF cold point node, and a second terminal coupled to a ground reference node; and
a baseband termination circuit connected to the quasi RF cold point node, wherein the baseband termination circuit includes a plurality of components, wherein the plurality of components includes a third inductive element, a resistor, and a second capacitance in series between the quasi RF cold point node and the ground reference node and a third capacitance between a baseband termination circuit node and the ground reference node, wherein the baseband termination circuit node is between the third inductive element and the resistor.

9. The packaged RF amplifier device of claim 8, wherein the third inductive element includes a third plurality of wirebonds.

10. The packaged RF amplifier device of claim 8, wherein the transistor is a gallium nitride transistor.

11. The packaged RF amplifier device of claim 8, further comprising:
an integrated passive device coupled to the device substrate between the first transistor die and the first output lead, wherein the integrated passive device includes the first quasi RF cold point node, the first capacitance, the third inductive element, the resistor, the second capacitance, and the third capacitance.

12. The packaged RF amplifier device of claim 8, further comprising:
a low frequency termination circuit comprising a fourth inductive element and a fourth capacitance connected in series between the baseband termination circuit node and the ground reference node.

13. The packaged RF amplifier device of claim 12, wherein the low frequency termination circuit resonates at a frequency less than 500 MHz.

14. The packaged RF amplifier device of claim 12, further comprising:
a harmonic trap circuit comprising a fifth inductive element and a fifth capacitance connected in series between the transistor output terminal and the ground reference node, and the harmonic trap circuit resonates at a second harmonic frequency of a fundamental frequency of operation of the RF amplifier.

15. The packaged RF amplifier device of claim 11, wherein the second capacitance and the third capacitance are integrally formed with the integrated passive device.

16. The packaged RF amplifier device of claim 8, further comprising:
a second input lead coupled to the device substrate;
a second output lead coupled to the device substrate;
a second transistor die coupled to the device substrate, wherein the second transistor die includes a second transistor coupled between the second input lead and the second output lead;
a second output-side impedance matching circuit having the T-match circuit topology coupled between the second transistor and the second output lead, and further having a second quasi RF cold point node; and
a second baseband termination circuit connected to the second quasi RF cold point node.

17. A method of manufacturing an RF amplifier device, the method comprising the steps of:
coupling an input lead to a device substrate;
coupling an output lead to the device substrate;
coupling a transistor die to the device substrate between the input and output leads, wherein the transistor die includes a transistor and a transistor output terminal, and wherein the transistor has a drain-source capacitance below 0.2 picofarads per watt;
coupling an integrated passive device to the device substrate between the transistor die and the input lead, wherein the integrated passive device includes a quasi RF cold point node, a ground reference node, a first capacitor with a first terminal connected to the quasi RF cold point node, and a second terminal coupled to the ground node, and a baseband termination circuit, wherein the baseband termination circuit includes a plurality of components, wherein the plurality of components includes a third inductive element, a resistor, and a second capacitance in series between the quasi RF cold point node and the ground reference node and a third capacitance between a baseband termination circuit node and the ground reference node, wherein the baseband termination circuit node is between the third inductive element and the resistor; and creating an output-side impedance matching circuit with a T-match circuit topology between the transistor output terminal and the output lead, wherein the T-match circuit topology includes the first capacitor, and the output-side impedance matching circuit is created by connecting first terminal of a first inductive element to the transistor output terminal, connecting a second terminal of the first inductive element to the quasi RF cold point node, wherein the first inductive element includes a first plurality of wirebonds, and connecting a first terminal of a second inductive element to the quasi RF cold point node, and coupling a second terminal of the second inductive element to the output lead, wherein the second inductive element includes a second plurality of wirebonds.

18. The method of claim 17, further comprising:

creating a low frequency termination circuit by coupling a fourth inductive element and a fourth capacitance connected in series between the baseband termination circuit node and the ground reference node.

19. The method of claim 18, wherein the low frequency termination circuit resonates at a frequency less than 500 MHz.

20. The method of claim 18, further comprising:

creating a harmonic trap circuit by coupling a fifth inductive element and a fifth capacitance connected in series between the transistor output terminal and the ground reference node, and the harmonic trap circuit resonates at a second harmonic frequency of a fundamental frequency of operation of the RF amplifier.

* * * * *